United States Patent [19]

Shum et al.

[11] Patent Number: 5,188,972
[45] Date of Patent: Feb. 23, 1993

[54] METHOD FOR MAKING BIPOLAR TRANSISTOR BY SELF-ALIGNING THE EMITTER TO THE BASE CONTACT DIFFUSION

[75] Inventors: Ying K. Shum, Cupertino; Sik K. Lui, Sunnyvale, both of Calif.

[73] Assignee: Sierra Semiconductor Corporation, San Jose, Calif.

[21] Appl. No.: 875,239

[22] Filed: Apr. 28, 1992

Related U.S. Application Data

[62] Division of Ser. No. 648,929, Feb. 1, 1991.

[51] Int. Cl.$^5$ .................... H01L 21/265; H01L 29/70
[52] U.S. Cl. ........................................ 437/31; 437/51; 437/60; 257/515; 257/516; 257/535
[58] Field of Search ............... 437/60, 31, 51; 357/50, 357/51, 23.6

[56] References Cited

U.S. PATENT DOCUMENTS

| | | | |
|---|---|---|---|
| 4,001,869 | 1/1977 | Brown | 437/31 |
| 4,484,211 | 11/1984 | Takemoto | 357/50 |
| 4,887,142 | 12/1989 | Bertotti et al. | 357/93 |
| 4,949,154 | 8/1990 | Haken | 357/23.6 |

OTHER PUBLICATIONS

S. Sze, VLSI Technology, pp. 504–506, (2nd Ed. McGraw-Hill) 1988.

W. Ko et al., IEEE Transaction on Electronics Devices, vol. ED-30, No. 3, entitled "A Simplified Fully Implanted Bipolar VLSI Technology", pp. 236–239 (Mar. 1983).

R. Hori et al., IEEE International Solidstate Circuits Conference, Feb. 27, 1987, pp. 280–281, entitled, "An Experimental 35ns 1 Mb BiCMOS Dram".

P. Van Bechen, Elektronica 81/19, entitled "Grote Computers op Enkele cm Square", (German language only).

Primary Examiner—Olik Chaudhuri
Assistant Examiner—Long Pham
Attorney, Agent, or Firm—Limbach & Limbach

[57] ABSTRACT

A semiconductor structure having a high precision analog polysilicon capacitor with a self-aligned extrinsic base region of a bipolar transistor is disclosed. The structure is formed by simultaneously forming the dielectric layer of the capacitor with the formation of the base region of the bipolar transistor. A final oxidation step in the formation of the capacitor causes the base region to diffuse to form a self-aligned extrinsic base diffusion region.

7 Claims, 4 Drawing Sheets

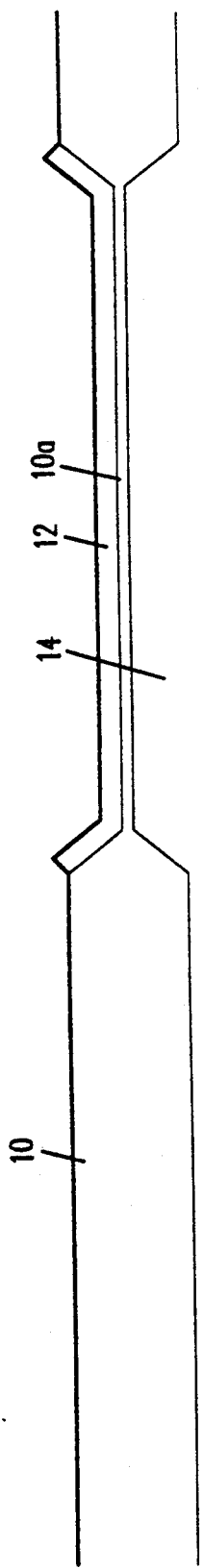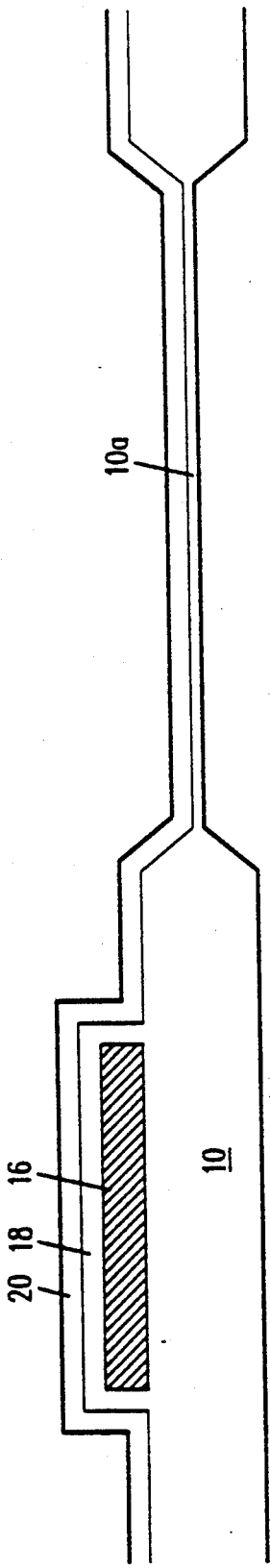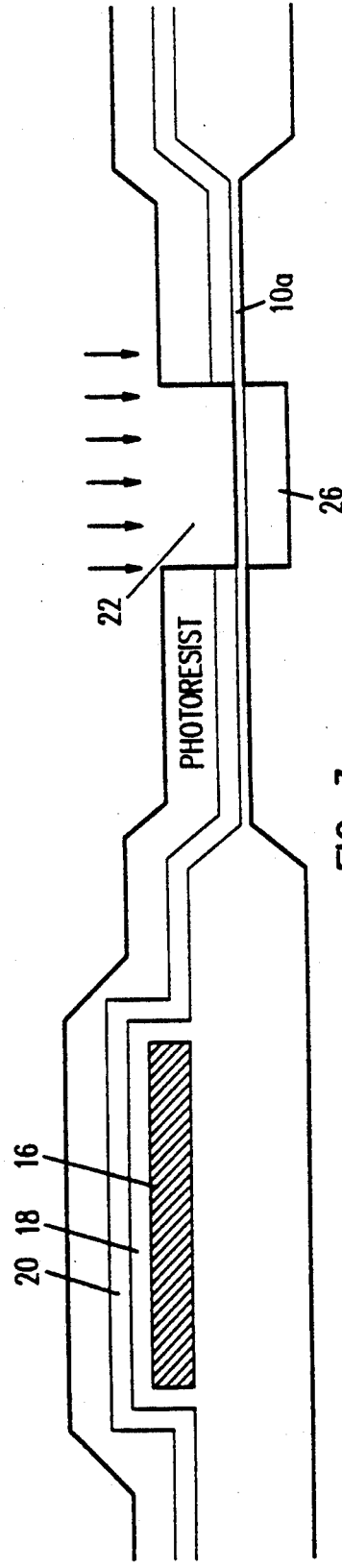

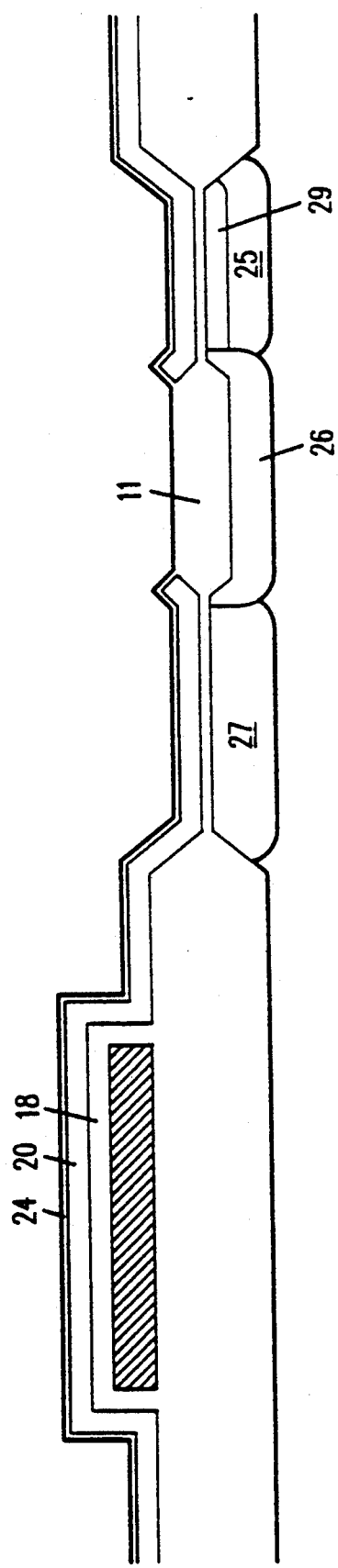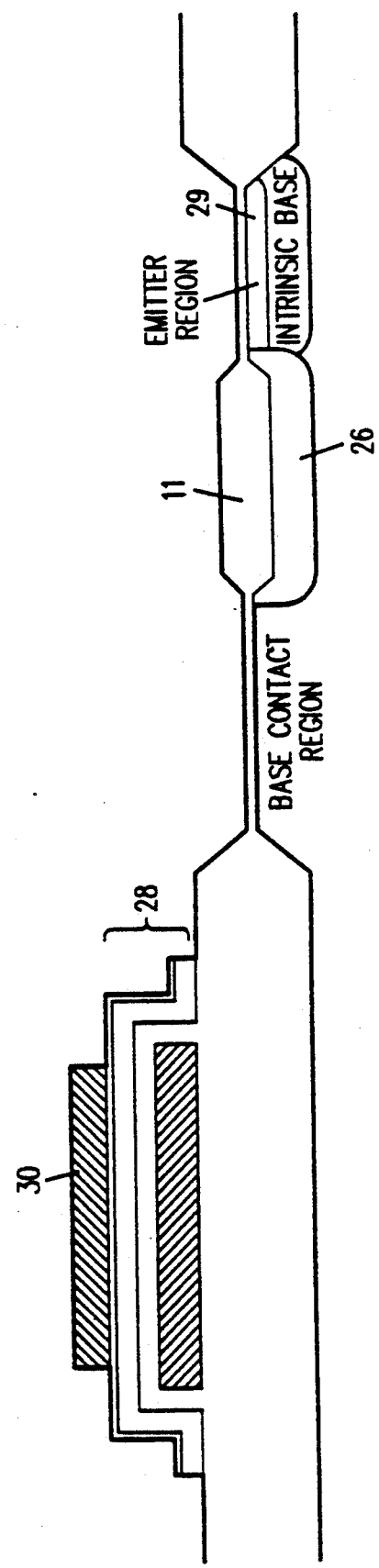

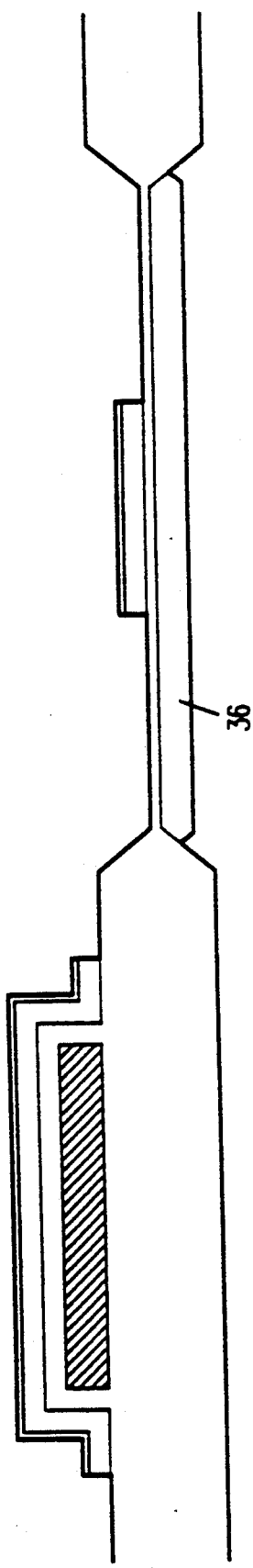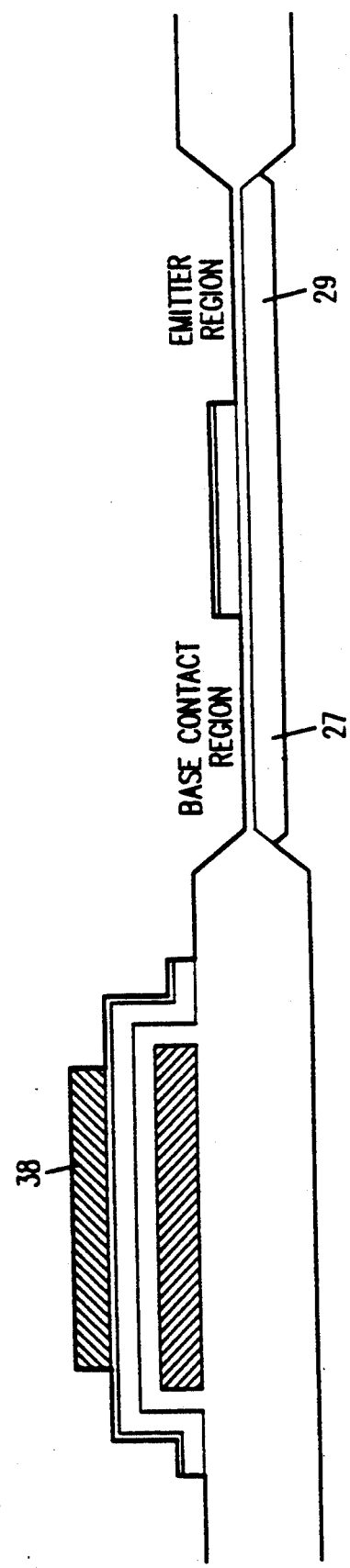

METHOD FOR MAKING BIPOLAR TRANSISTOR BY SELF-ALIGNING THE EMITTER TO THE BASE CONTACT DIFFUSION

This is a division of application Ser. No. 07/648,929, filed Feb. 1, 1991, now pending.

BACKGROUND

1. Field of the Invention

The present invention relates to a semiconductor structure and a method for making the structure, and more particularly to a semiconductor structure which comprises a self-aligned bipolar transistor where the emitter self-aligns to the base contact diffusion using an extrinsic base region, and a polysilicon capacitor, and a method which makes them simultaneously.

2. Discussion on of the Prior Art

It is well known that a key element in fabricating high precision CMOS analog integrated circuits is the use of a polysilicon to polysilicon capacitor, with a silicon dioxide—silicon nitride-silicon dioxide (O—N—O) dielectric region between the polysilicon electrodes. Such a structure provides high linearity and good matching characteristics. However, the fabrication of the O—N—O region requires at least three thermal heat cycles.

In order to fabricate a high performance bipolar transistor, it is well known that self-alignment techniques must be utilized. See, e.g., S. Sze, *VLSI Technology*, pp. 504-06 (2d ed. McGraw-Hill 1988); W Ko et al., *A Simplified Fully Implanted Bipolar VLSI Technology*, IEEE Transactions on Electronic Devices, Vol. ED-30, No. 3, pp. 236-39 (March 1983). A self-aligned extrinsic base, for example, is formed by opening a window in a silicon nitride layer after the formation of the field oxide structure. This allows independent optimization of the base doping level for optimum transistor action, consistent low base resistance, and good ohmic contact to the base.

In one prior art bipolar transistor, a mesa structure comprising of a silicon dioxide region with a silicon nitride region thereon, is formed on an extrinsic base, with a base contact region to one side and an emitter region to the other side.

In the fabrication of a typical BiCMOS device, the bipolar portion is formed first, then the CMOS portion. In the event the CMOS portion requires a precision capacitor element, the heat cycles required to form the O—N—O region would cause the extrinsic base of the bipolar device to undergo additional diffusion. For this reason, it has been very difficult to use a self-alignment scheme to form a bipolar transistor which includes the polysilicon O—N—O polysilicon capacitor process module, without compromising the performance of the bipolar transistor.

In addition, the extra heat cycles required to form the O—N—O capacitor would result in significantly different bipolar transistor characteristics, between processes with and without the O—N—O capacitor process module.

Therefore, it would be desirable to maintain a minimum diffusion of the extrinsic base when forming a bipolar transistor which includes the polysilicon O—N—O polysilicon capacitor process module.

SUMMARY OF THE INVENTION

Therefore, the present invention is a semiconductor structure having a semiconductor substrate, such as silicon. The substrate has a substantially planar surface, with a first region and a second region on the surface with the first region spaced apart from the second region. A capacitor is formed over the first region of the substrate with the capacitor comprising a first polysilicon layer, a dielectric layer over the first polysilicon layer, and a second polysilicon layer over the dielectric layer. A bipolar transistor is formed over the second region with the bipolar transistor having a self-aligned extrinsic base region.

A method for making the structure is also disclosed.

BRIEF DESCRIPTION OF THE DRAWINGS

FIG. 1 is a side plan view of a portion of a semiconductor structure, in the process of being made into one embodiment of the semiconductor structure of the present invention.

FIG. 2 is a side plan view of a portion of a semiconductor structure, in the process of being made into one embodiment of the semiconductor structure of the present invention, after the structure of FIG. 1 has been formed.

FIG. 3 is a side plan view of a portion of a semiconductor structure, in the process of being made into one embodiment of the semiconductor structure of the present invention, after the structure of FIG. 2 has been formed.

FIG. 4 is a side plan view of a portion of a semiconductor structure, in the process of being made into one embodiment of the semiconductor structure of the present invention, after the structure of FIG. 3 has been made.

FIG. 5 is a side plan view of one embodiment of a semiconductor structure of the present invention.

FIG. 8 is a side plan view of a portion of a semiconductor structure, in the process of being made into another embodiment of the semiconductor structure of the present invention, after the structure of FIG. 7 has been made.

FIG. 9 is a side plan view of another embodiment of a semiconductor structure of the present invention.

DETAILED DESCRIPTION OF THE INVENTION

Figure 6:
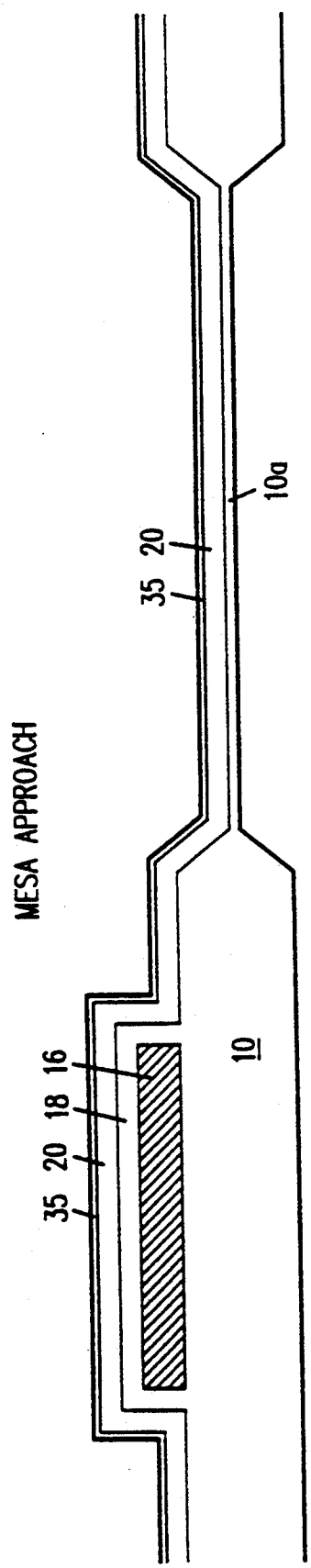
FIG. 6 is a side plan view of a portion of a semiconductor structure, in the process of being made into another embodiment of the semiconductor structure of the present invention, after the structure of FIG. 2 has been formed.

Referring to FIG. 1, there is shown a semiconductor substrate 14, such as silicon, on which a field oxide region 10 is formed. A silicon nitride region 12 is formed over a buffer oxide layer 10a. The steps to form the field oxide region 10, the buffer oxide layer 10a, and the silicon nitride region 14 are well known.

One method is to form the buffer oxide layer 10a on the entire surface of the silicon substrate 14, by oxidizing the silicon substrate. Silicon nitride 12 is then deposited over the buffer oxide layer 10a. The silicon nitride layer 12 is patterned and etched using conventional photolithographic techniques. This can be done, for example, by applying a photoresist layer. The photoresist layer is exposed and selective portions are removed, exposing portions of the silicon nitride 12. The exposed portion of silicon nitride 12 is removed. Local oxidation is then applied. Since silicon nitride prevents oxygen from penetrating through to oxidize the silicon thereunder, silicon dioxide is formed on a shallow surface layer of the silicon nitride and in the exposed regions of the silicon substrate forming the field oxide regions 10.

Referring to FIG. 2, after the structure of FIG. 1 is formed, the silicon nitride layer 12 is then removed. A 3000–4000 Å thick polysilicon layer 16 is deposited over the field oxide region 10 by conventional LPCVD. The polysilicon layer 16 is then doped with an n-type dopant such as phosphorus or arsenic at approximately 900°–1000° C. The polysilicon layer 16 is patterned and etched by conventional photolithographic methods to form the polysilicon electrode 16.

A layer of silicon dioxide 18 is then grown over the polysilicon electrode 16. This is done by oxidizing the polysilicon 16 at 1000°–1100° C. in dry oxygen to obtain 300–400 Å of silicon dioxide 18. A layer of silicon nitride 20 with a thickness between 300–400 Å is deposited on top of the silicon dioxide by conventional LPCVD process.

Referring to FIG. 3, a photoresist mask is used to define a window 22 to form the extrinsic base 26 of the bipolar transistor. The silicon nitride 20 is plasma etched exposing the buffer oxide 10a. A p-type dopant, such as boron, is implanted through the window 22, through the silicon dioxide 10a into the substrate 14 to create the extrinsic base region 26.

Referring to FIG. 4, the structure is subjected to oxidation after the photoresist has been removed. Approximately 200–3000 Å of silicon dioxide is grown over the extrinsic base region 26 in a wet oxygen ambient. The oxidation of the extrinsic base region 26 simultaneously forms the final silicon dioxide layer 24, forming the interpoly dielectric 28, which comprises the silicon dioxide layer 18, the silicon nitride layer 20, and the silicon dioxide layer 24. The oxidation cycle also causes the dopants implanted in the base region 26 to diffuse under the oxide region 11. This forms the self-aligned extrinsic base region 26. The extrinsic base diffusion region 26 electrically connects the base contact diffusion region 27, which is to one side of the extrinsic base region 26, to the intrinsic base 25, which is under the emitter diffusion 29, which is to the other side of the base region 26.

Referring to FIG. 5, a photoresist mask is used to define the dielectric 28 of the poly capacitor. The exposed dielectric 28 is then etched away by a combination of plasma and wet etching. A second polysilicon electrode 30 is formed in a manner similar to the first polysilicon electrode 16. The remaining steps required to form the collector (not shown), intrinsic base 25, base contact diffusion region 27 and emitter 29 of the bipolar transistor are well known and are used to form the bipolar transistor.

A variation of the above invention can be seen by referring to FIGS. 6–9. After the structure of FIG. 2 is formed, the silicon nitride layer 20 is oxidized at 900°–950° C. in wet oxygen for 30–60 minutes to form a thin layer of silicon dioxide 35 as shown in FIG. 6.

Figure 7:
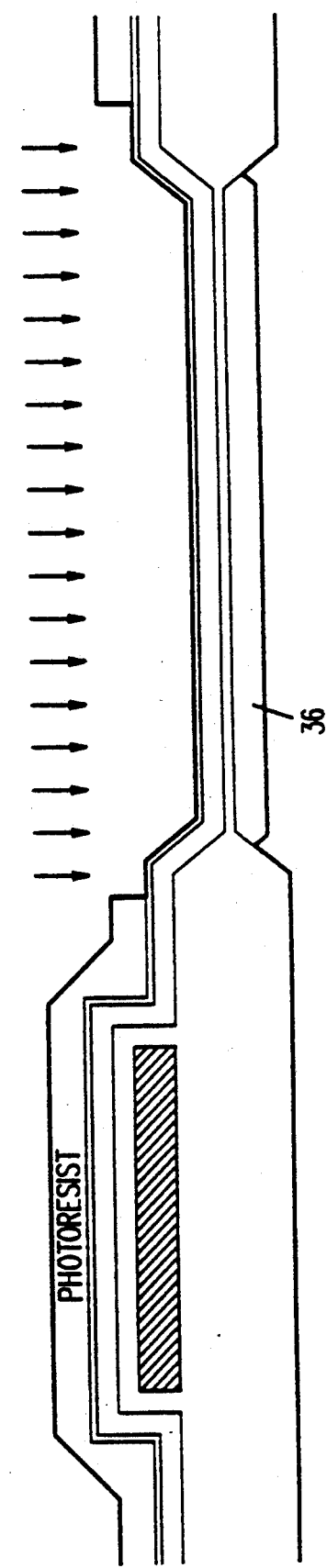
FIG. 7 is a side plan view of a portion of a semiconductor structure, in the process of being made into another embodiment of the semiconductor structure of the present invention, after the structure of FIG. 6 has been formed.

Referring to FIG. 7, a photoresist mask is applied to the structure so that the base region 36 is exposed.

Boron is implanted through the silicon dioxide 35, silicon nitride 20, and buffer oxide layer 10a to form the base 36 of the bipolar transistor.

Referring to FIG. 8, another photoresist mask is applied to define the dielectric region over the first poly electrode and the base region 36 of the bipolar transistor. The exposed dielectric layer is then removed by a combination of plasma and wet etching. The dielectric is separated into two spaced apart regions. A first region is over the electrode 16 and a second region is over the base region 36. The dielectric left over the bipolar transistor separates the emitter region 29 from the base contact diffusion region 27, with the self-aligned extrinsic base region 26 being formed directly beneath the second region of the dielectric.

Referring to FIG. 9, a second polysilicon electrode 38 is formed in a manner similar to the first polysilicon electrode. Conventional methods are then used to form the base contact diffusion and emitter of the bipolar transistor.

What is claimed is:

1. An improved method for making a semiconductor structure, wherein the structure has a bipolar transistor portion with a self-aligned extrinsic base, and a capacitor portion having a pair of polysilicon electrodes separated by a dielectric region, the improvement comprising forming the self-aligned extrinsic base simultaneously with the dielectric region.

2. A method for making a semiconductor structure on a semiconductive substrate having a field oxide region and a buffer oxide region thereon, the structure having a bipolar transistor portion with a self-aligned extrinsic base and a capacitor portion having a pair of polysilicon electrodes separated by a silicon dioxide-silicon nitride-silicon dioxide dielectric region, said method comprising:

a. depositing a first layer of polysilicon on a portion of the field oxide region, forming a first polysilicon electrode;

b. oxidizing the first polysilicon electrode;

c. depositing a silicon nitride layer over the oxidized polysilicon and the buffer oxide region;

d. masking an extrinsic base region over a portion of the buffer oxide region;

e. etching the silicon nitride layer to form an opening in the nitride layer above the portion of the buffer oxide region;

f. implanting a dopant material through the window to form the extrinsic base;

g. oxidizing the nitride layer while simultaneously diffusing the dopant material in said base; and h. depositing a second layer of polysilicon on the oxidized nitride layer, forming the second polysilicon electrode.

3. A method for making a semiconductor structure, comprising:

a. forming a field oxide region and a buffer oxide region on a silicon substrate;

b. forming a first capacitor electrode on a portion of the field oxide region;

c. forming an insulating dielectric region over the first electrode to isolate the first electrode;

d. forming a self-aligned extrinsic base region of a bipolar transistor in a first portion of the silicon substrate simultaneously with the formation of the insulating dielectric region;

e. forming a second capacitor electrode over the dielectric region;

f. forming an emitter region of said bipolar transistor in a second portion of the silicon substrate; and g. forming a collector region of said bipolar transistor in a third portion of the silicon substrate.

4. A method according to claim 3, wherein the step of forming a first capacitor electrode comprises:

a. depositing polysilicon at high temperature on a first area of the field oxide region;

b. doping the polysilicon with an n-type material; and c. patterning the polysilicon to form the first electrode.

5. A method according to claim 4, wherein the simultaneous steps of forming an insulating dielectric region and forming an extrinsic base region comprise:

a. oxidizing the first polysilicon electrode;

b. depositing a silicon nitride layer over the oxidized polysilicon and the buffer oxide region;

c. masking an extrinsic base region over the first portion of the silicon substrate;

d. etching the nitride layer to form a window in the nitride layer above the first portion of silicon substrate;

e. implanting a dopant material through the window; and f. oxidizing the nitride layer while simultaneously diffusing the dopant to form the extrinsic base.

6. A method according to claim 4, wherein the simultaneous steps of forming an insulating dielectric region and forming an extrinsic base region comprise:

a. oxidizing the first polysilicon electrode;

b. depositing a silicon nitride layer over the oxidized polysilicon and the buffer oxide region;

c. oxidizing the nitride layer;

d. masking the structure to form a window over a portion of the buffer oxide region;

e. implanting a dopant material through the window to form the base region; and f. masking the structure to form simultaneously a dielectric region over the first polysilicon electrode and a region above the portion over the buffer oxide region to expose the substrate to a base contact diffusion region and an emitter region.

7. A method for making a semiconductor structure on a semiconductive substrate having a field oxide region and a buffer oxide region thereon, the structure having a bipolar transistor portion with a self-aligned extrinsic base and a capacitor portion having a pair of polysilicon electrodes separated by a silicon dioxide-silicon nitride-silicon dioxide dielectric region, said method comprising:

a. depositing a first layer of polysilicon on a portion of the field oxide region, forming a first polysilicon electrode;

b. oxidizing the first polysilicon electrode;

c. depositing a silicon nitride layer over the oxidized polysilicon and the buffer oxide region;

d. oxidizing the nitride layer;

e. masking the structure to form a window over a portion of the buffer oxide region;

f. implanting a dopant material through the window to form the base region;

g. masking the structure to form simultaneously a dielectric region over the first polysilicon electrode and a region above the portion over the buffer oxide region to expose the substrate to a base contact diffusion region and an emitter region; and h. depositing a second layer of polysilicon on the oxidized nitride layer, forming the second polysilicon electrode.

* * * * *